(12) United States Patent
Huang

(10) Patent No.: US 6,791,464 B2
(45) Date of Patent: Sep. 14, 2004

(54) APPARATUS OF MONITORING MOTOR VEHICLE'S ELECTRIC POWER AND METHOD THEREOF

(75) Inventor: Yung-Sheng Huang, Taipei (CN)

(73) Assignee: BPPower Inc., Taipei (TW)

( * ) Notice: Subject to any disclaimer, the term of this patent is extended or adjusted under 35 U.S.C. 154(b) by 0 days.

(21) Appl. No.: 10/281,303

(22) Filed: Oct. 28, 2002

(65) Prior Publication Data

US 2004/0080406 A1 Apr. 29, 2004

(51) Int. Cl.$^7$ .............................................. G08B 21/00
(52) U.S. Cl. ........................ 340/636.15; 340/636.1; 340/636.12; 340/636.13; 340/636.15; 340/636.19; 324/433
(58) Field of Search ........................... 340/636.15, 635, 340/636.1, 636.12, 636.13, 636.19, 663; 324/430, 432, 433

(56) References Cited

U.S. PATENT DOCUMENTS

| | | | | | |
|---|---|---|---|---|---|
| 5,381,096 A | * | 1/1995 | Hirzel | ........................ | 324/427 |
| 5,828,218 A | * | 10/1998 | Yokoo et al. | ................ | 324/427 |
| 5,900,734 A | * | 5/1999 | Munson | ....................... | 324/433 |
| 6,097,193 A | * | 8/2000 | Bramwell | .................... | 324/429 |
| 6,249,106 B1 | * | 6/2001 | Turner et al. | ................ | 320/136 |
| 6,424,157 B1 | * | 7/2002 | Gollomp et al. | ............. | 324/430 |

* cited by examiner

Primary Examiner—Toan N. Pham
(74) Attorney, Agent, or Firm—Troxell Law Office PLLC

(57) ABSTRACT

An apparatus of monitoring motor vehicle's electric power and method thereof are provided. The apparatus is disposed in the motor vehicle and includes a monitor and alarm device parallel connected to both a battery to be measured and a starting motor of the motor vehicle. The starting motor is taken as a load for forming an outer loop sampling circuit, 1/t second is set as a sampling time interval during discharging, voltage and current curves are formed by connecting a plurality of continuous voltage values each sampled in 1/t second, a minimum voltage of the voltage curve is compared with a predetermined alarm value for determining a status of the battery to be measured, and an alarm is issued in time if the status of the battery to be measured is abnormal.

18 Claims, 14 Drawing Sheets

APPARATUS OF MONITORING MOTOR VEHICLE'S ELECTRIC POWER AND METHOD THEREOF

BACKGROUND OF THE INVENTION

1. Field of the Invention

The present invention relates to monitoring apparatus and more particularly to an apparatus of monitoring electric power of a motor vehicle's battery and method thereof so as to issue an alarm if the power is lower than a predetermined level prior to starting the engine.

2. Description of Related Art

It is known that a driver has to start the engine of an automobile prior to starting it. Also, for successfully starting the engine, there must be sufficient power in the battery. In practice, however, there is no way for the driver to know the power level of the battery prior to starting the engine. It is often that the driver knows the battery low only when the start fails. Alternatively, the battery may be already damaged before a next start even it is successful in this start.

Moreover, many different factors such as ambient temperature, charging conditions and time, and load discharge all can affect a useful life of battery Thus, it is complicated. A conventional battery (e.g., NP battery) has the following characteristic curves regarding discharge time versus discharge voltage, ambient temperature versus available power of battery, and storage time versus available power of battery as shown in FIGS. 12 to 14 respectively. Thus, for ensuring a successful start of the automobile it is desirable to monitor the available power of battery in a long time basis in order to overcome disadvantages that may be caused by the above factors.

SUMMARY OF THE INVENTION

It is an object of the present invention to, in a motor vehicle, provide an apparatus of monitoring its electric power and method thereof in a long time basis. The apparatus comprises a monitor and alarm device parallel connected to both a battery to be measured and a starting motor of the motor vehicle wherein a single loop technique the starting motor is taken as a load for forming an outer loop sampling circuit, 1/t second is set as a sampling time interval during discharging, a voltage curve is formed by connecting a plurality of continuous voltage values each sampled in 1/t second, a voltage measured at the parallel terminals is dropped significantly temporarily during an engine starting period, thus forming a lowest point of the voltage curve, a minimum voltage of the voltage curve as obtained at the lowest point is compared with a predetermined alarm value for determining a status of the battery to be measured, and an alarm is issued in time if the status of the battery to be measured is abnormal.

It is another object of the present invention to provide an apparatus of monitoring motor vehicle's electric power and method thereof. A monitor and alarm device of the apparatus is directly parallel connected to both a battery to be measured and a starting motor of the motor vehicle wherein a double loop technique is employed to monitor an available power of a current source to be measured in a long time basis, the starting motor is taken as a load for forming an outer loop sampling circuit, an inner loop sampling circuit is formed by utilizing an internal load of the monitor and alarm device, and alternatively perform different monitoring modes by suitably dividing time into a plurality of time intervals.

It is a further object of the present invention to provide an apparatus of monitoring motor vehicle's electric power and method thereof. A monitor and alarm device of the apparatus takes any point of the voltage curve during an engine starting as a battery measurement point. That is, a voltage value at any point of a curve section from the engine starting point to an alternator charging point is taken as a battery measurement point. Hence, it is possible of determining a status of the battery to be measured and issuing an alarm in time if the status of the battery to be measured is abnormal.

The above and other objects, features and advantages of the present invention will become apparent from the following detailed description taken with the accompanying drawings.

DETAILED DESCRIPTION OF THE PREFERRED EMBODIMENTS

Referring to FIGS. 1 to 7, there is shown a first preferred embodiment of an apparatus and method thereof in accordance with the invention. In the apparatus, a monitor and alarm device 20 is directly parallel connected to both a battery to be measured B2 and a starter unit (e.g., starting motor as described below) S1. In a single loop, the starting motor S1 is taken as a load for forming an outer loop sampling circuit. 1/t second is set as a sampling time interval (from the very beginning of switching on time of the motor vehicle power by a vehicle's key to the disconnecting time of the control of the CPU) during discharging. A voltage curve is formed by connecting a plurality of continuous voltage values each sampled in 1/t second. Also, a minimum voltage of the curve is compared with a predetermined alarm value set by the invention so as to determine a status of the battery, thereby issuing an alarm in time if the status of the battery is abnormal.

Figure 1:
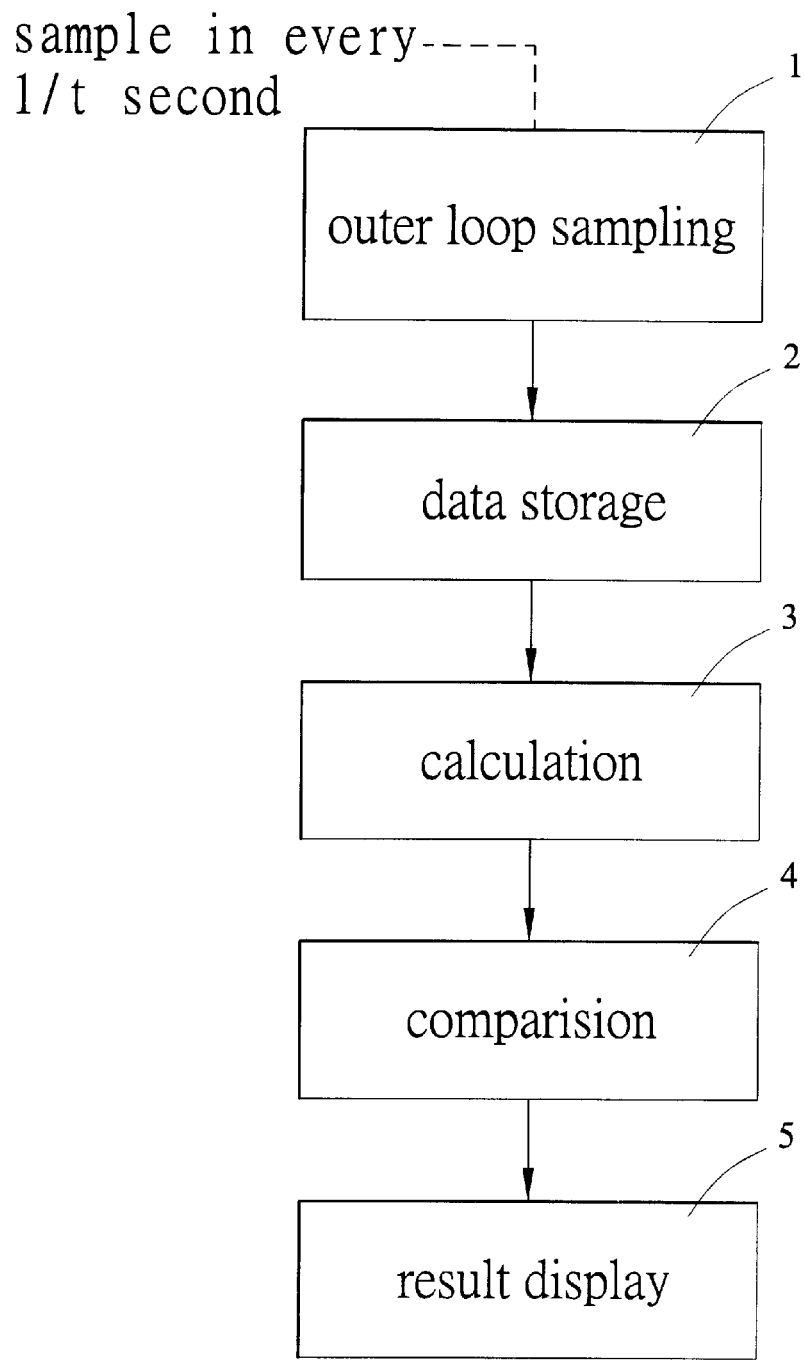
FIG. 1 is a flow chart illustrating a process of monitoring a motor vehicle's electric power according to a first preferred embodiment of the invention.

Referring to FIG. 1, there is shown a process for monitoring a motor vehicle's electric power in accordance with the invention. The monitoring process comprises the following steps:

In step 1 (i.e., outer loop sampling), a starting motor S1 is taken as a load. The invention samples the battery to be measured B2 every 1/t second for obtaining a sampled voltage.

In step 2 (i.e., data storage), a voltage curve is obtained by connecting a plurality of continuous voltage values each sampled in 1/t second.

In step 3 (i.e., calculation), the invention calculates a minimum voltage and records the same.

In step 4 (i.e., comparison), the invention compares the recorded minimum voltage with a predetermined alarm value set by the invention. If the minimum voltage is higher than the alarm value it means that the battery to be measured B2 is normal. To the contrary, if the minimum voltage is equal to or lower than the alarm value it means that the lowest point of the voltage curve has been reached or passed and the battery to be measured B2 is determined to be abnormal In step 5 (i.e., result display), a result of calculation in step 3 is displayed on a display. Further, an alarm is issued if the alarm value is reached in step 4

The steps 1 to 5 can be repeatedly performed so as to monitor the battery to be measured B2 for a long time. As a result, the driver can know the power level of the battery prior to starting the engine by noticing whether an alarm has been issued.

Figure 2:
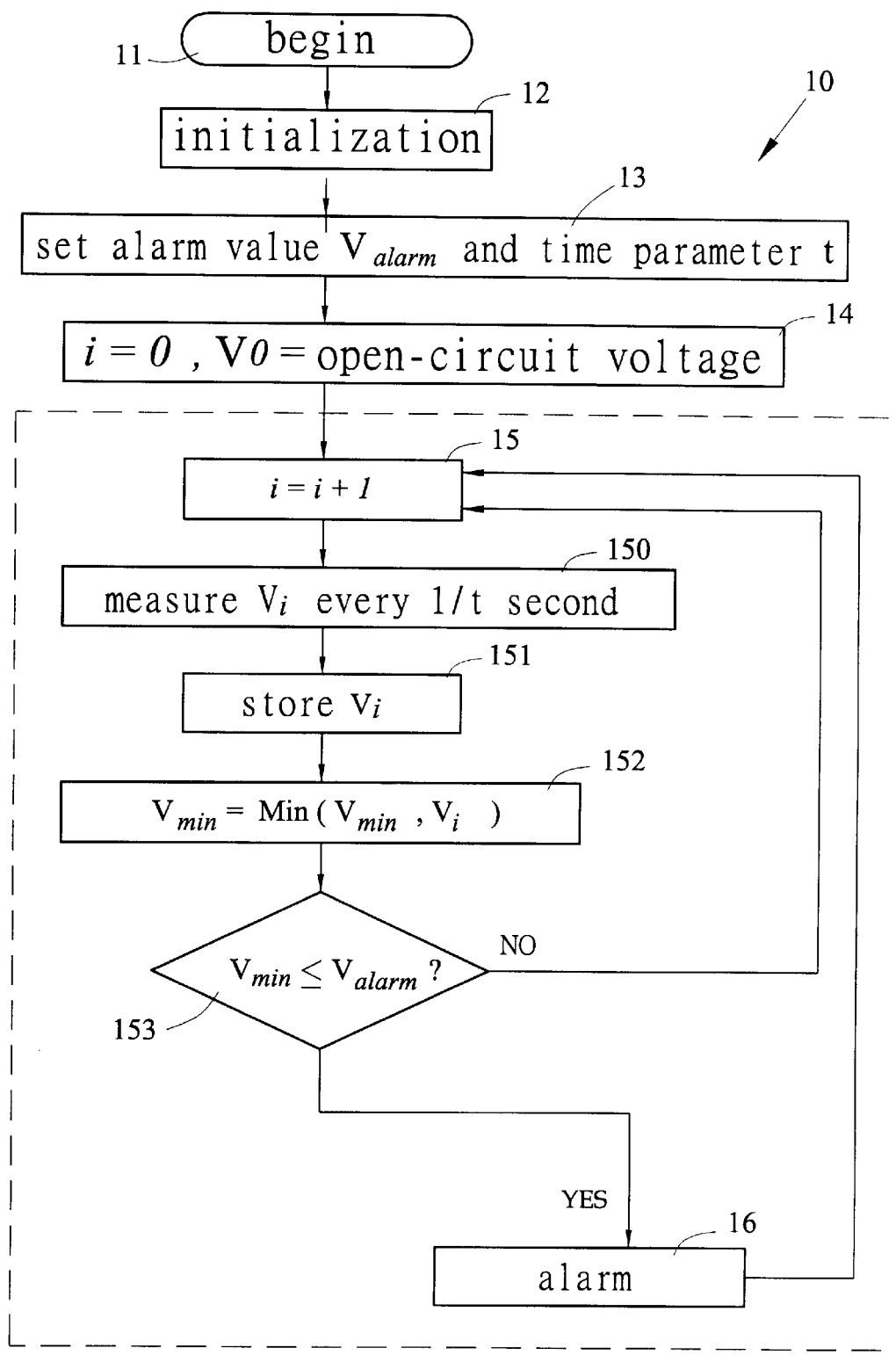
FIG. 2 is a detailed flow chart illustrating the FIG. 1 process.

Referring to FIG. 2, there is shown a detailed flow chart illustrating the FIG. 1 process according to the invention. The process 10 comprises the following steps:

Step 11 is a beginning in which an interrupt vector address is the beginning of the process. Step 12 is an initialization in which registers and input/output (I/O) pins are initialized and the interrupt vector and a timer are enabled Next, an initial value of the register is set, the interrupt vector and the timer are enabled, and status and initial value of each pin is defined respectively. In step 13, a predetermined alarm value $V_{alarm}$ and a time parameter t are set by the invention. In step 14, initial value of the ith sampling is set as zero (i.e., count equal to 0) by the invention. Further, an open-circuit voltage Vo is measured. In step 15, an increment of i is performed. In step 150, the invention samples the battery to be measured B2 every 1/t second for obtaining the ith sampled voltage Vi. In step 151, a voltage curve is obtained by connecting a plurality of continuous sampled voltage values Vi. In step 152, the invention performs a calculating operation to find a function of the minimum voltage $V_{min}$ and then to compare the minimum voltage $V_{min}$ with the current sampled voltage Vi for replacing the current minimum voltage $V_{min}$ with Vi if Vi is less than the current minimum voltage $V_{min}$. In step 153, the invention compares the current minimum voltage $V_{min}$ with the predetermined alarm value $V_{alarm}$. If the minimum voltage $V_{min}$ is equal to or lower than the alarm value $V_{alarm}$ it means that the lowest point of the voltage curve has been reached or passed and the process then goes to step 16. Otherwise (i.e., the battery to be measured B2 is normal), the process loops back to step 15. In step 16, an alarm is issued by a display. The process then loops back to step 15

Figure 3:
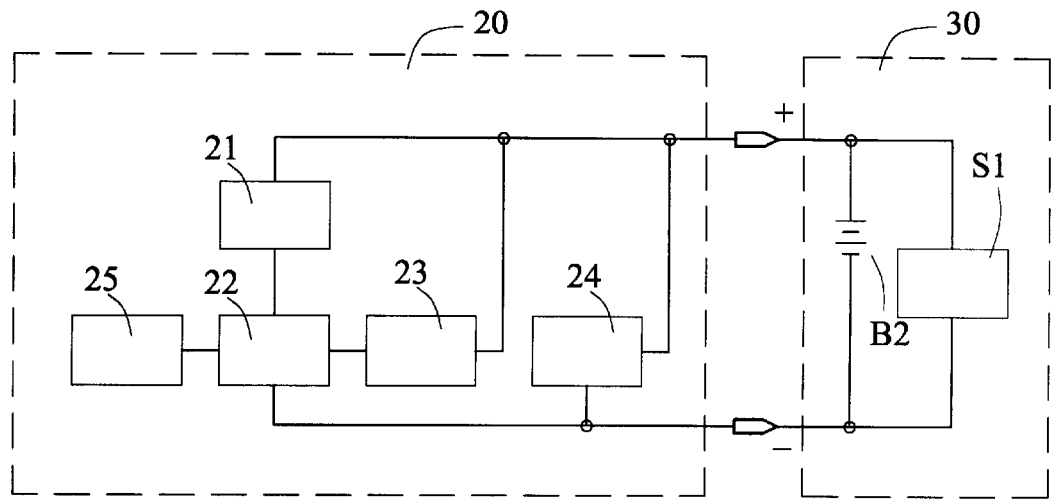
FIG. 3 is a block diagram of a first preferred embodiment of apparatus of monitoring vehicle's electric power according to the invention.

FIG. 3 is a block diagram of a first preferred embodiment of the monitor and alarm device 20 for monitoring a vehicle's electric power according to the invention. The monitor and alarm device 20 is installed in an automobile and comprises a stabilization circuit 21, a CPU (central processing unit) or MCU (microprocessor control unit) 22, a voltage sampling circuit 23, a current control circuit 24, and a display circuit 25. The monitor and alarm device 20 is parallel connected to a current source to be measured 30. Each component is described in detail below. The stabilization circuit 21 acts to provide a constant current to the CPU or MCU 22 and other components. The CPU or MCU 22 acts to control sampling of voltage, data storage, calculation, comparison, result display, etc. The voltage sampling circuit 23 is commanded by the CPU or MCU 22 to fetch voltage data from the current source to be measured 30 every 1/t second. The fetch voltage data is then sent to the CPU or MCU 22 for processing. The display circuit 25 is commanded by the CPU or MCU 22 to show the measurement result on a LCD (liquid crystal display) or any of other suitable displays.

The current source to be measured 30 comprises the battery to be measured B2 and the parallel starting motor S1. Thus, the monitor and alarm device 20 is directly parallel connected to both the battery to be measured B2 and the starting motor S1 in which the starting motor S1 is taken as a load for forming an outer loop sampling circuit. Also, 1/t second is defined as a time interval. A voltage curve is formed by connecting a plurality of continuous voltage values sampled in the time intervals. Moreover, a minimum voltage of the curve is compared with a predetermined alarm value set by the invention so as to determine a status of the battery to be measured B2, thereby issuing an alarm if necessary.

Figure 3A:
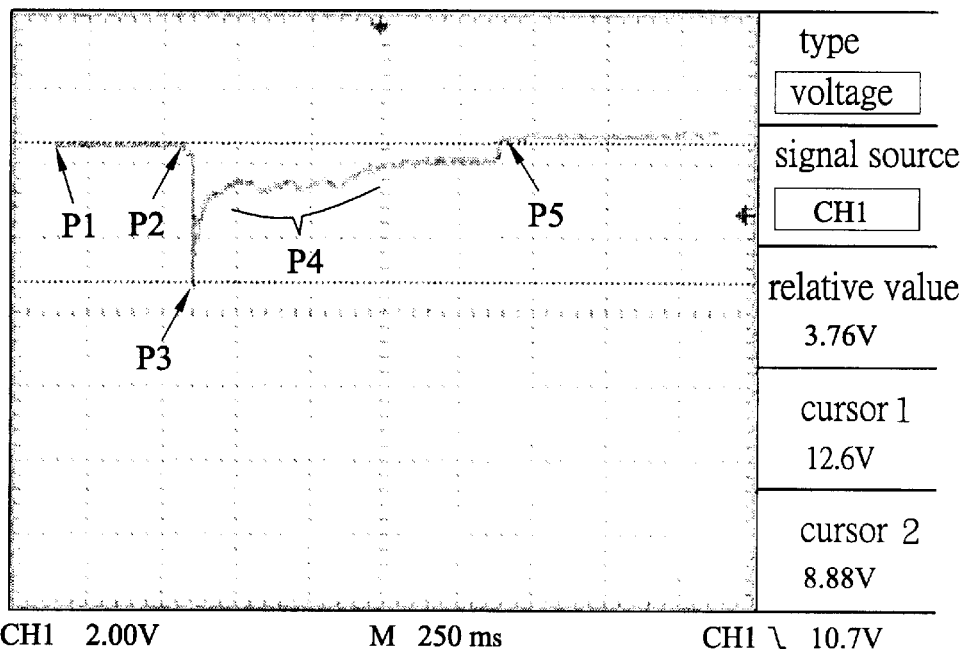
FIGS. 3A, 3B, 3C and 3D are graphs illustrating experimental values such as voltage values measured by the apparatus of the invention.
Figure 3B:
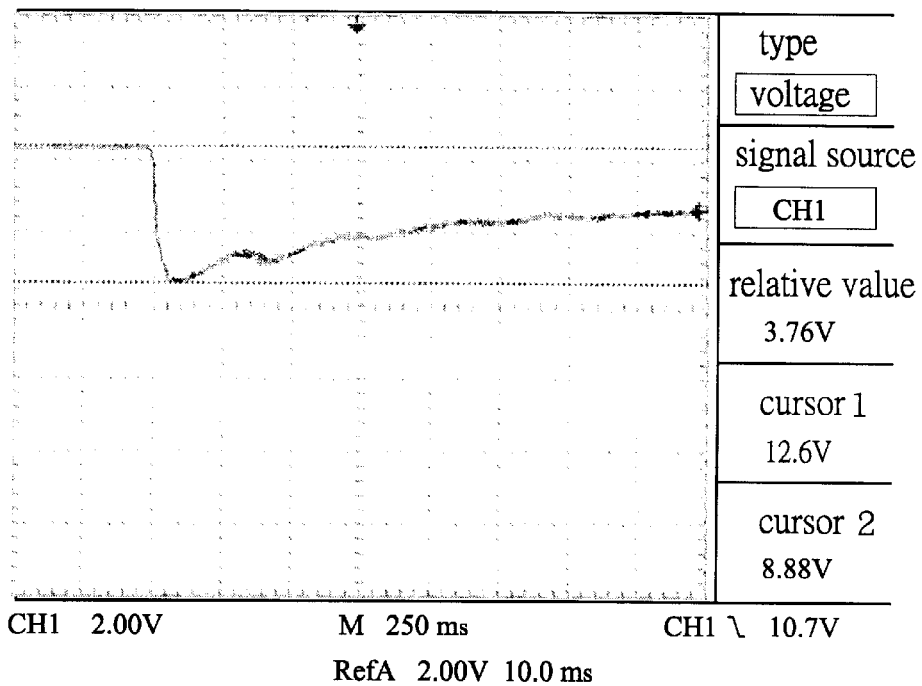
Figure 3C:
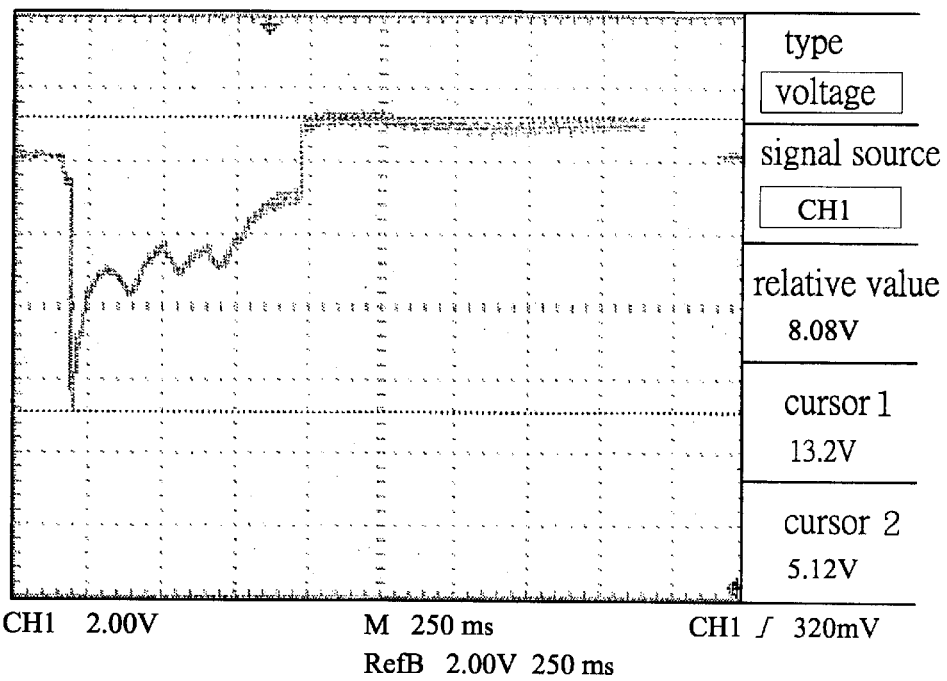
Figure 3D:
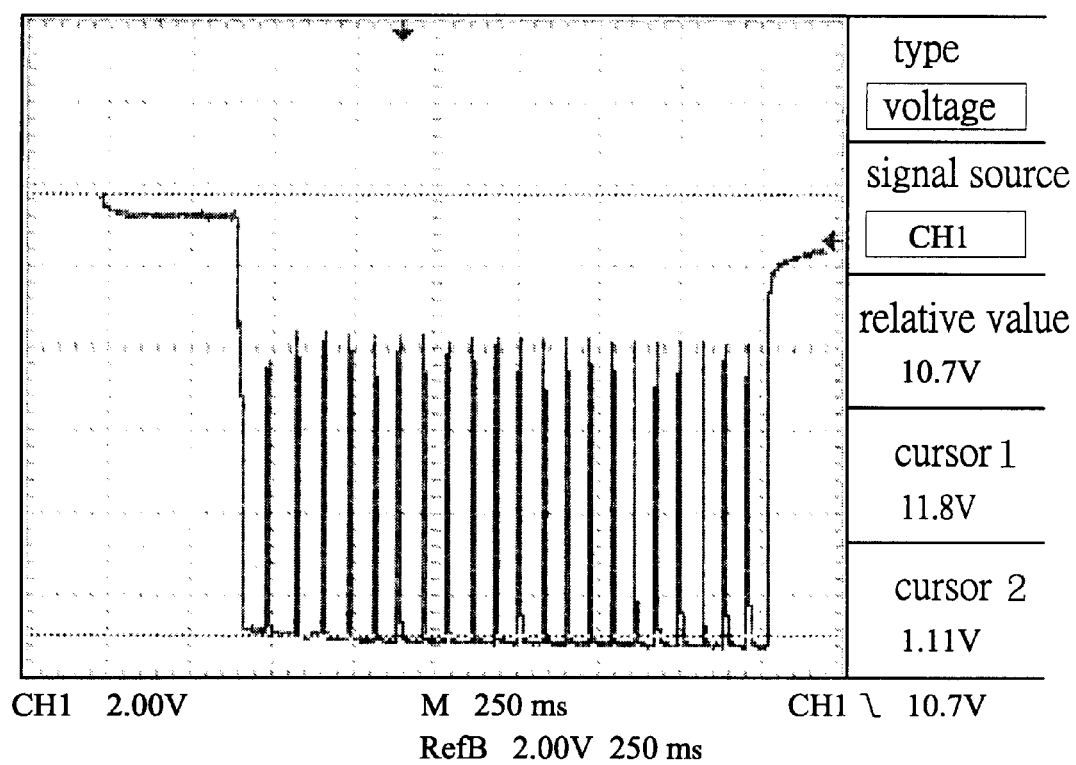

FIGS. 3A, 3B, 3C and 3D are graphs illustrating experimental values (e.g., voltage values) with respect to three different batteries as measured by the apparatus of the invention. In FIG. 3A, a voltage curve of the first battery to be measured begins from point P1 to point P2 where the engine is starting. A voltage measured at the parallel terminals is dropped significantly temporarily during the engine starting period, thus forming a lowest point P3 of the voltage curve. Hence a minimum voltage is obtained at point P3. The minimum voltage is 8.88 V as indicated by cursor 2 (see FIG. 3A). A subsequent section P4 represents that the engine has been started. It is possible of determining whether the starting motor is operating normally by observing the curve section P4. For example, three ripples should be formed at the section P4 after the engine has been started if the starting motor is a three-phase motor. If the number of ripples is less than three it means that the starting motor does not operate normally. Hence, it is possible of determining whether the battery to be measured B2 is operating normally by observing the curve section P4. A final point P5 represents a charging point of an alternator. FIG. 3B is shown an enlarged view of the lowest portion of the voltage curve shown in FIG. 3A. The minimum voltage is 8.88 V as indicated by cursor 2. It is possible of observing a detailed variation of the voltage curve at this portion. In FIG. 3C, showing the second battery to be measured, and the minimum voltage is 5.12 V as indicated by cursor 2. This means that the battery is about to be replaced. In FIG. 3D, showing the third battery to be measured, the minimum voltage is 1.11 V as indicated by cursor 2. A plurality of substantially parallel bar-waves are formed rather than a continuous curve consisting of small variations as indicated by the curve section P4 in FIG. 3A. This means that the starting motor is not operating normally. That is, the starting motor cannot be started by the battery having the minimum voltage. This means that the battery is dead. In view of the above, it is possible of determining whether the battery to be measured is operating normally by observing variations of the voltage curves measured with respect to three batteries. This is a significant characteristic of the invention.

Figure 4:
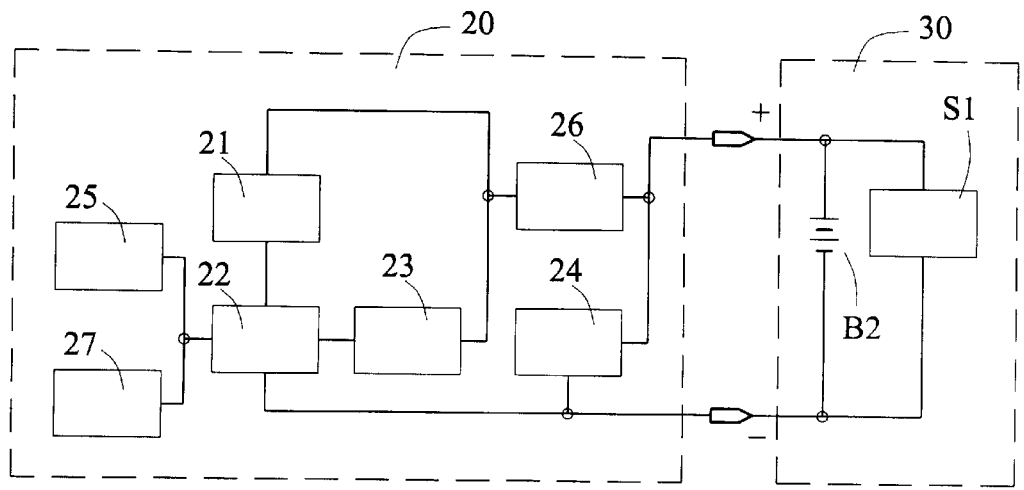
FIG. 4 is a block diagram of a second configuration of the monitor and alarm device being parallel connected to a current source to be measured according to the invention.

Referring to FIG. 4, there is shown a block diagram of a second configuration of the monitor and alarm device 20 according to the invention In the embodiment, the monitor and alarm device 20 further comprises a battery B2 polarity reverse protection circuit 26 for preventing a damage to the current source to be measured 30 from occurring due to polarity reverse of battery and an audio alarm circuit 27 commanded by the CPU or MCU 22 to issue an audio alarm on an occurred irregularity (e.g., power low, aging, or damage) of the battery B2 based on a measurement result.

Figure 5:
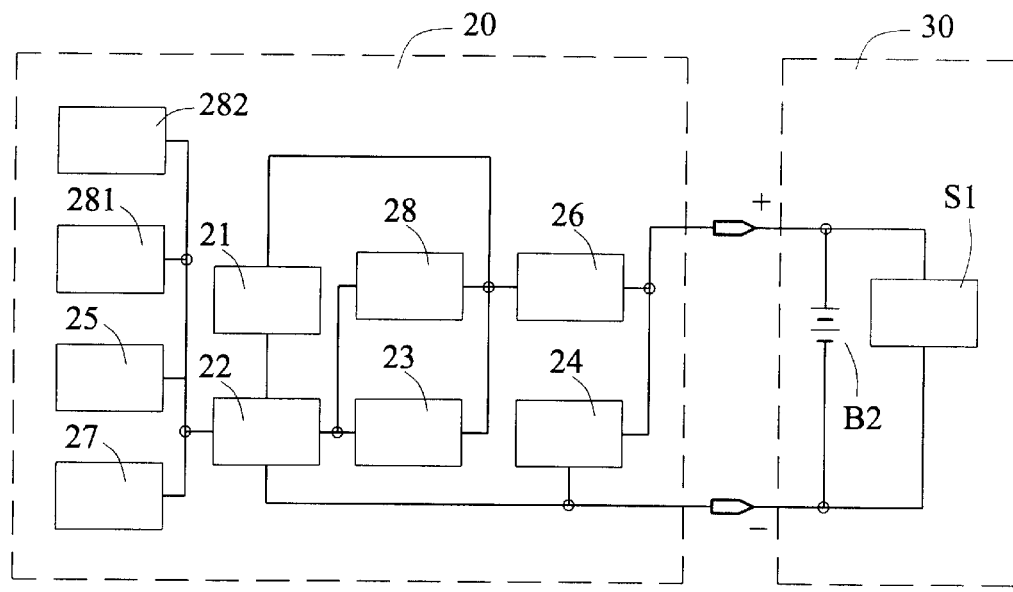
FIG. 5 is a block diagram of a third configuration of the monitor and alarm device being parallel connected to the current source to be measured according to the invention.

Referring to FIG. 5, there is shown a block diagram of a third configuration of the monitor and alarm device 20 according to the invention. In the embodiment, the monitor and alarm device 20 further comprises a power detection circuit 28 commanded by the CPU or MCU 22 to fetch voltage data from the current source to be measured 30 for sending to the CPU or MCU 22 to determine a status of the charging battery B2 and subsequently send the status to the CPU or MCU 22 for further processing, a digital display 281 commanded by the CPU or MCU 22 to display the measurement result in a digital form, and a digital signal interface converter 282 commanded by the CPU or MCU 22 to communicate with the external through an interface based on the measurement result In the invention, the CPU or MCU 22 is able to detect whether a charging irregularity is occurred at the battery B2 since the monitor and alarm device 20 is parallel connected to the battery B2. Voltage measured on the parallel side will increase to a predetermined value during charging. In other words, a charging irregularity can be easily found if the voltage value does not reach to the predetermined value. Hence, it is possible of detecting the charging irregularity of the battery B2 by the power detection circuit 28. Also, the CPU or MCU 22 will issue an alarm in response to the charging irregularity.

Figure 6:
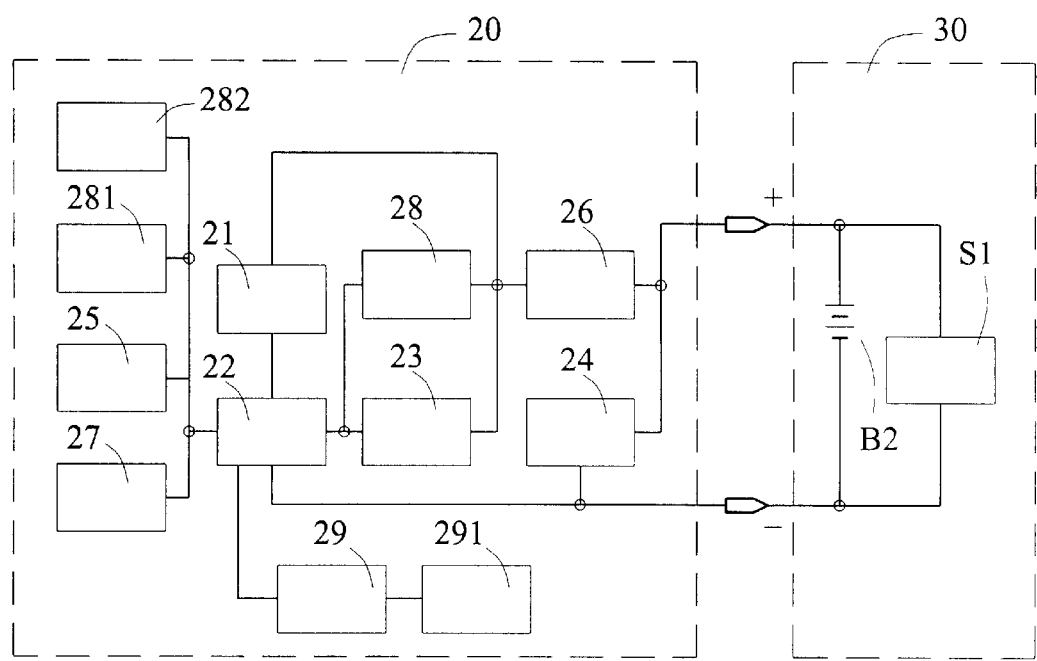
FIG. 6 is a block diagram of a fourth configuration of the monitor and alarm device being parallel connected to the current source to be measured according to the invention.

Referring to FIG. 6, there is shown a block diagram of a fourth configuration of the monitor and alarm device 20 according to the invention. In the embodiment, the monitor and alarm device 20 further comprises a battery temperature sensor 291 and a battery temperature detection circuit 29 for sending temperature data of the battery sensed by the battery temperature sensor 291 to the CPU or MCU 22 so as to calculate a correct available power of battery by referring to a characteristic curve of battery temperature without being adversely affected by environment factors. The correct available power of the battery is in turn used for modifying an alarm value. For information about the available power of battery versus ambient temperature, refer to the characteristic curves in FIGS. 13, 14 above.

Figure 7:
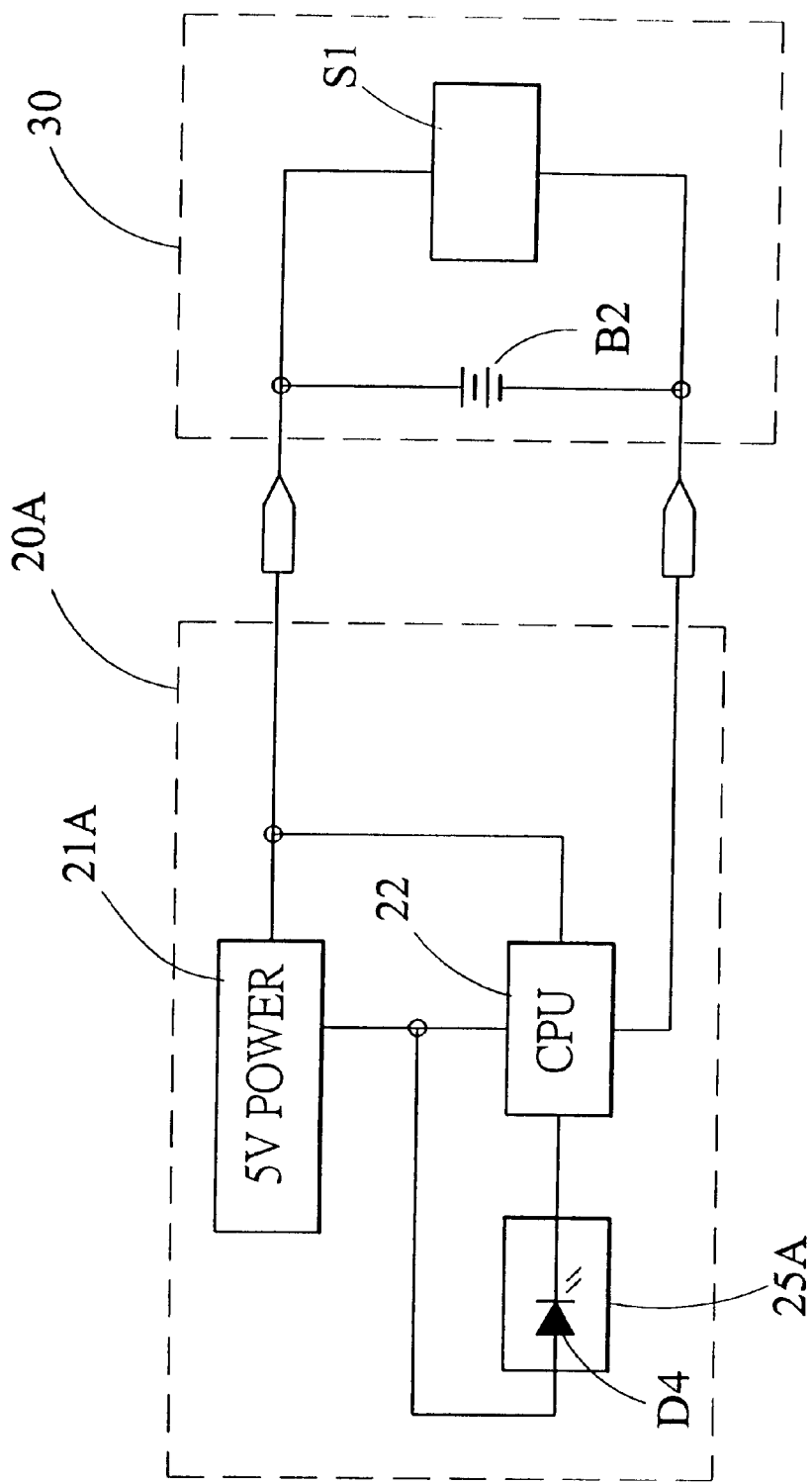
FIG. 7 depicts a circuit diagram of the apparatus being parallel connected to a battery to be measured.

Referring to FIG. 7, it depicts a simplified circuit diagram of the apparatus of the present invention. As shown, the apparatus of the present invention basically comprises a monitor and alarm device 20A which is directly parallel connected to a current source 30 to be measured. In the current source 30, B2 represents a battery to be measured, and S1 represents a starting motor. In the alarm device 20A, 25A represents a LED D4. 21A represents a 5V DC power source to provide a DC current to CPU 22. CPU 22 serves to control sampling voltage, data storage, calculation, comparison, and result display, etc. Therefore, the apparatus of this configuration of the present invention can also perform the same functions as mentioned above.

Referring to FIGS. 8 to 11, there is shown a second preferred embodiment of the invention. In brief, a method of the invention comprises implementing a double loop technique to monitor an available power of the current source to be measured 30 in a long time basis, taking the starting motor S1 as a load for forming an outer loop sampling circuit, forming an inner loop sampling circuit by utilizing an internal load of the monitor and alarm device 20, alternatively performing different monitoring modes by suitably dividing time into a plurality of time intervals, and optimizing the same. Referring to FIGS. 3 to 6 again, in the second embodiment the monitor and alarm device 20 further comprises a current control circuit 24 which is commanded by the CPU or MCU 22 to control and adjust current on a load so as to measure an output power of the current source to be measured 30.

Figure 8:
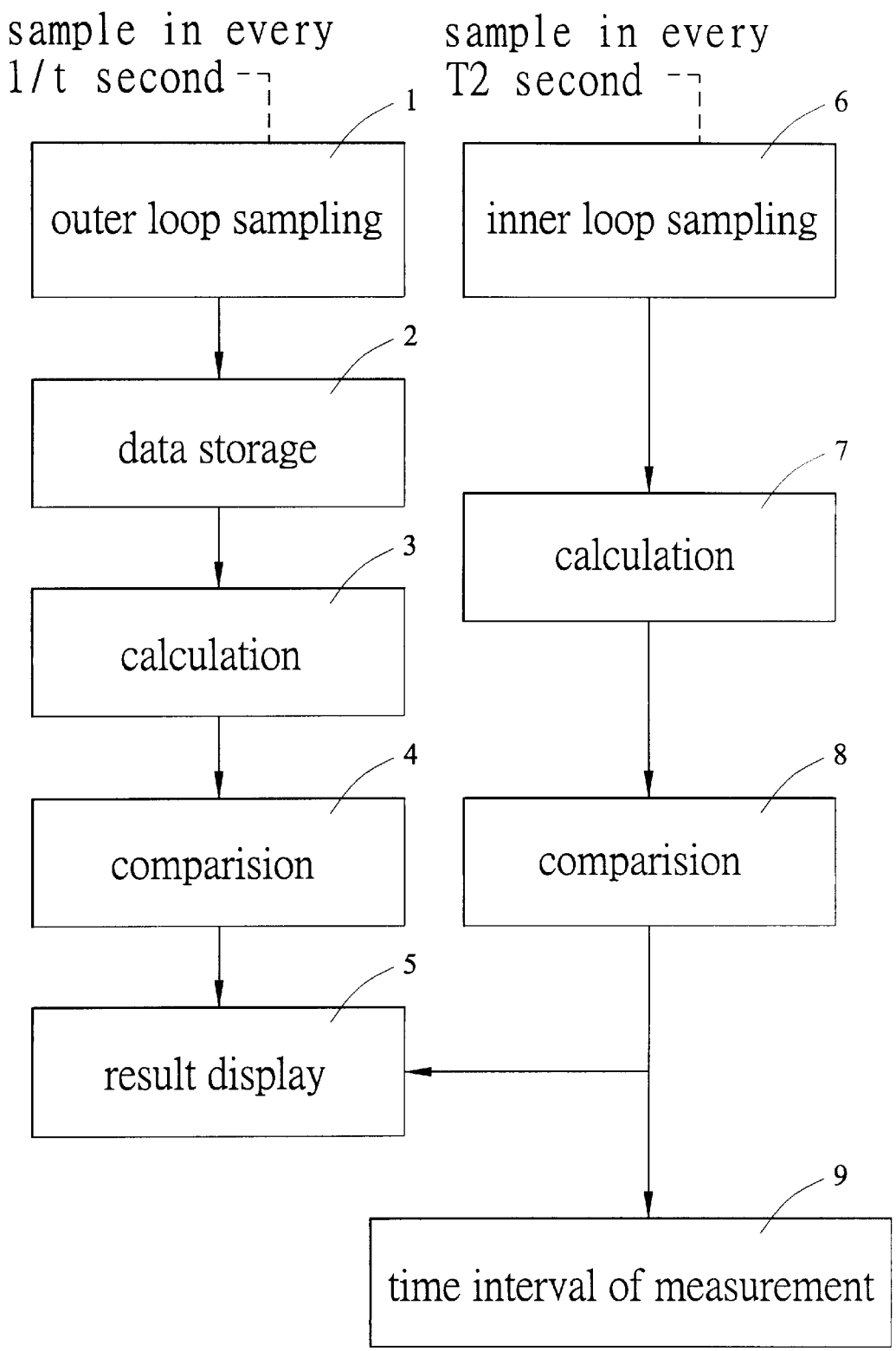
FIG. 8 is a flow chart illustrating a process of monitoring electric power of a motor vehicle's battery according to a second preferred embodiment of the invention.

FIG. 8 is a flow chart illustrating a process of monitoring a motor vehicle's electric power according to the second preferred embodiment of the invention It is found that the monitoring process on the outer loop sampling circuit is substantially the same as the first preferred embodiment. Thus a detailed description thereof is omitted herein for the sake of brevity. The monitoring process on the inner loop sampling circuit comprises the following steps In step 6 (i.e., inner loop sampling), an internal load of the monitor and alarm device 20 is set as a load. The invention discharges the battery B2 every T2 second (which is a very short period of time) by switching a power transistor for obtaining a sampled voltage. The discharging is repeated N times by the invention so as to obtain N sampled voltage values.

In step 7 (i.e., calculation), the invention calculates an average voltage and records the same.

Figure 12:
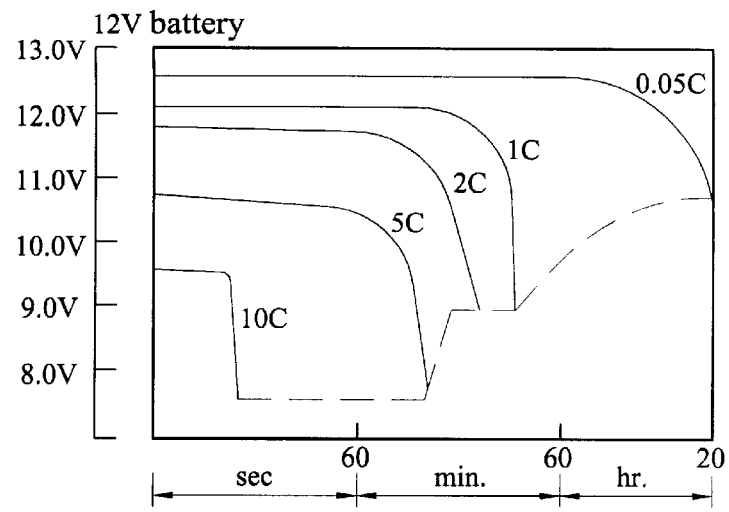
FIG. 12 is graph illustrating discharge time versus discharge voltage according to a conventional NP battery.
Figure 13:
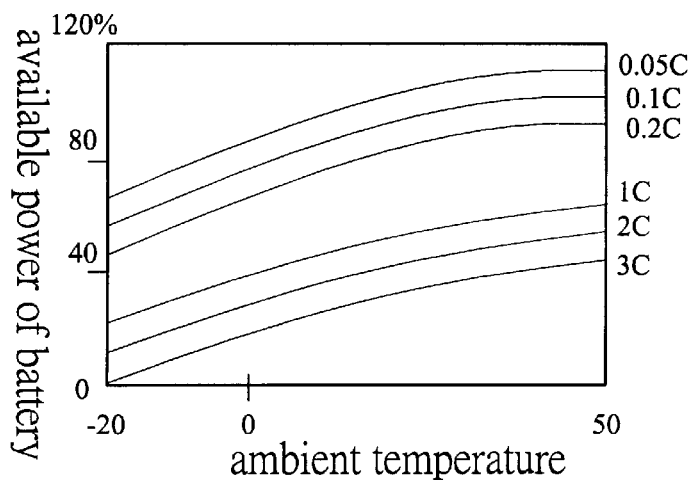
FIG. 13 is graph illustrating ambient temperature versus available power of battery according to the conventional NP battery.
Figure 14:
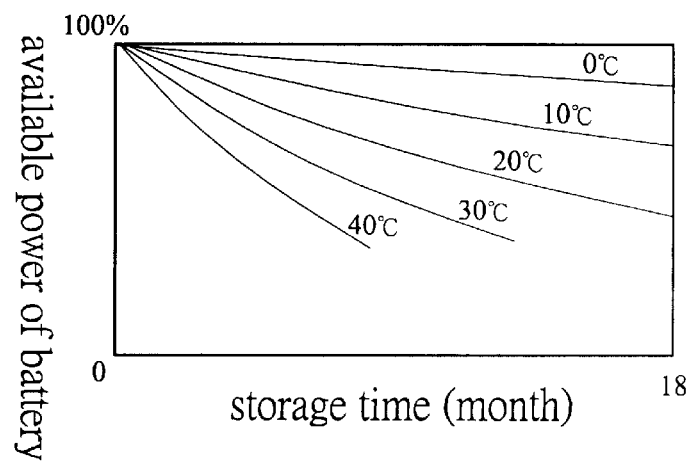
FIG. 14 is graph illustrating storage time versus available power of battery according to the conventional NP battery.

In step 8 (i.e., comparison), as referring to the characteristic curves in FIGS. 12 to 14 above, the gradient at the end of the characteristic curve tends to vary significantly, i.e., a correct prediction is difficult. Hence, the invention sets a predetermined alarm value in advance. The invention compares the recorded average voltage obtained in step 7 with the predetermined alarm value. Further, the result is displayed as in step 5. Furthermore, if the average voltage is equal to or lower than the alarm value an alarm is issued accordingly.

In a final step 9 (i.e., time interval of measurement), the invention measures the available power of battery every T2 second and waits a predetermined period of time for a next measurement.

By repeating steps in FIG. 8, it is possible of monitoring the battery B2 for a long time.

Figure 9:
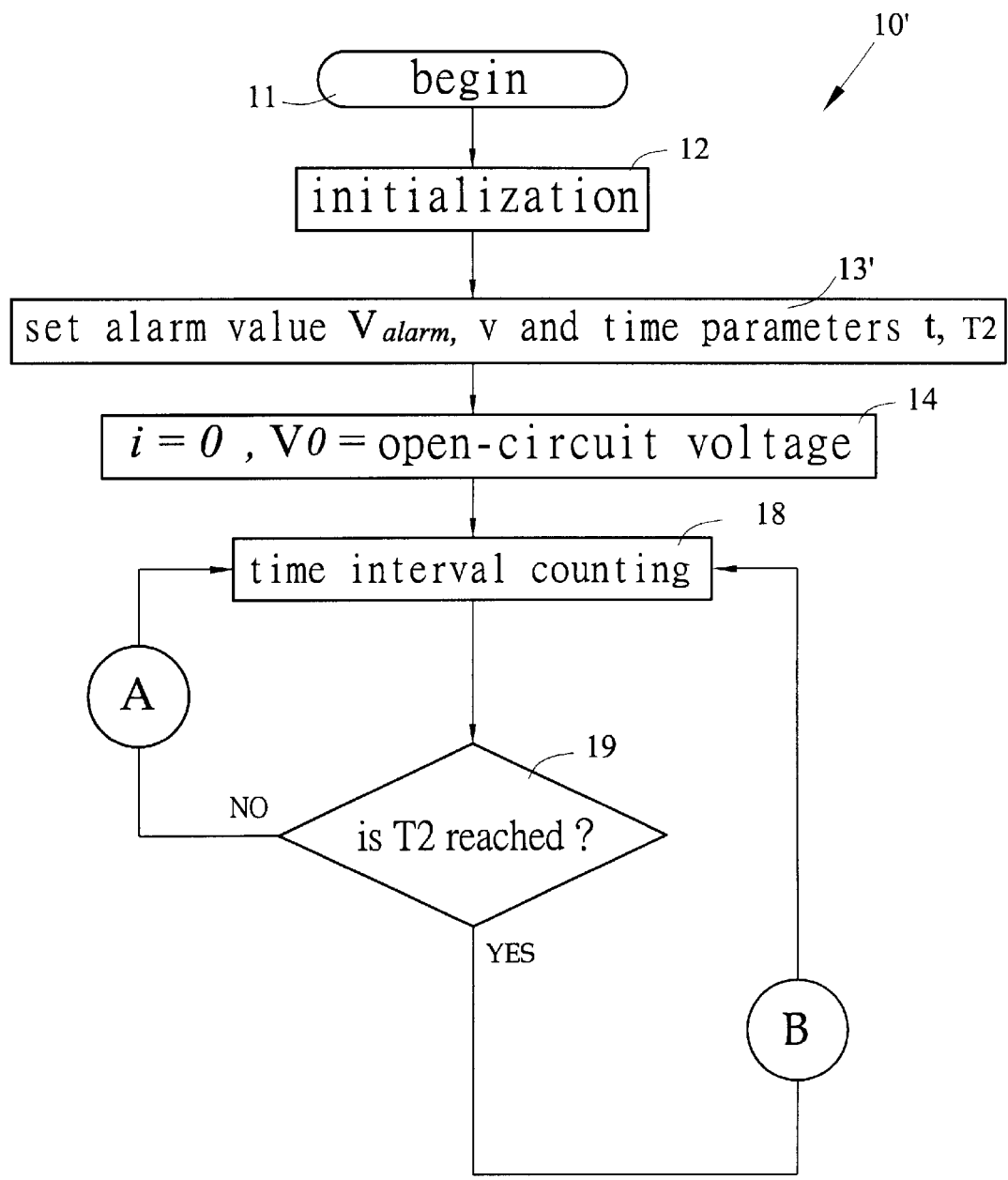
FIGS. 9, 9A, and 9B are detailed flow charts illustrating the FIG. 8 process respectively.
Figure 9A:
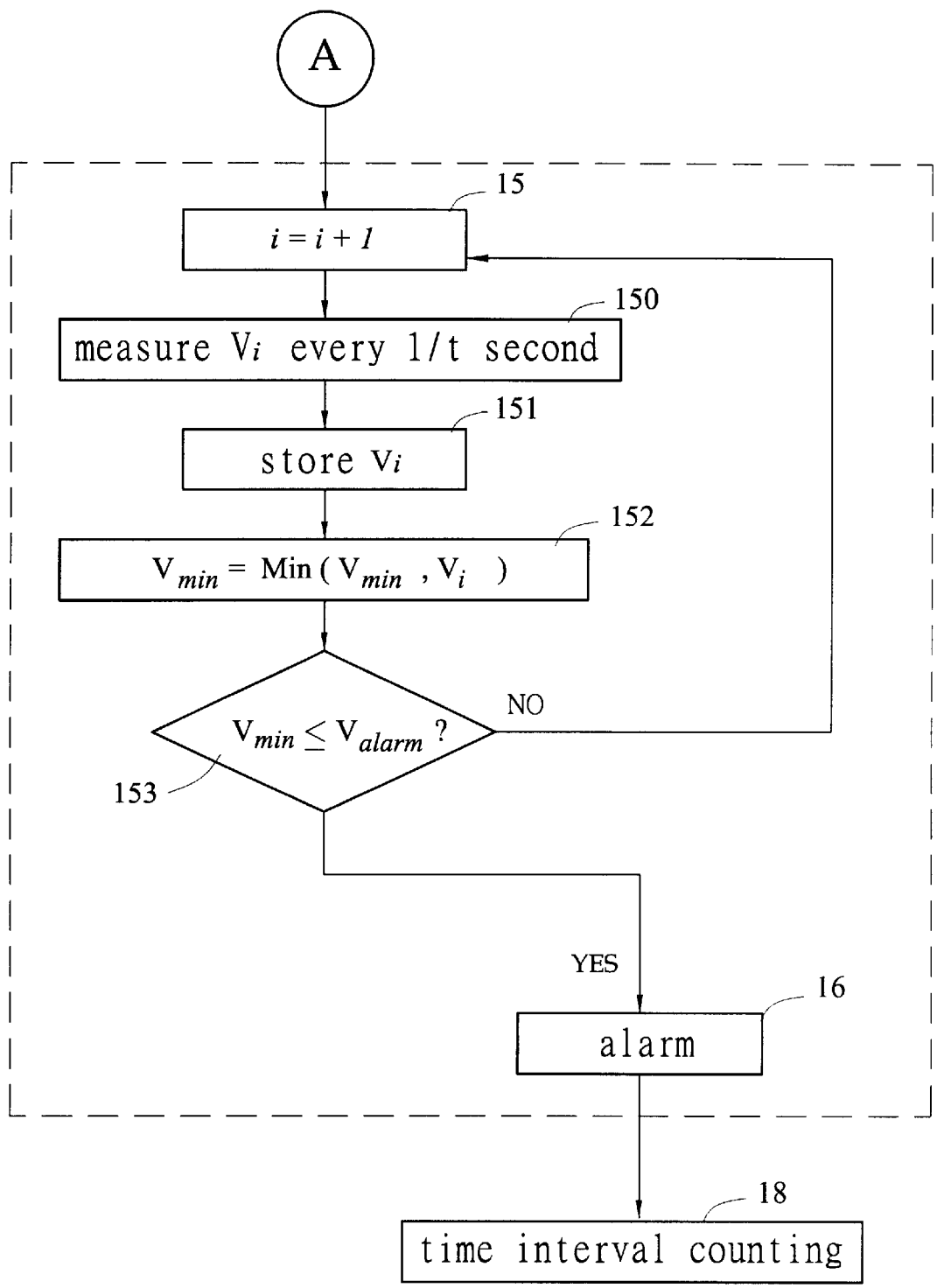
Figure 9B:
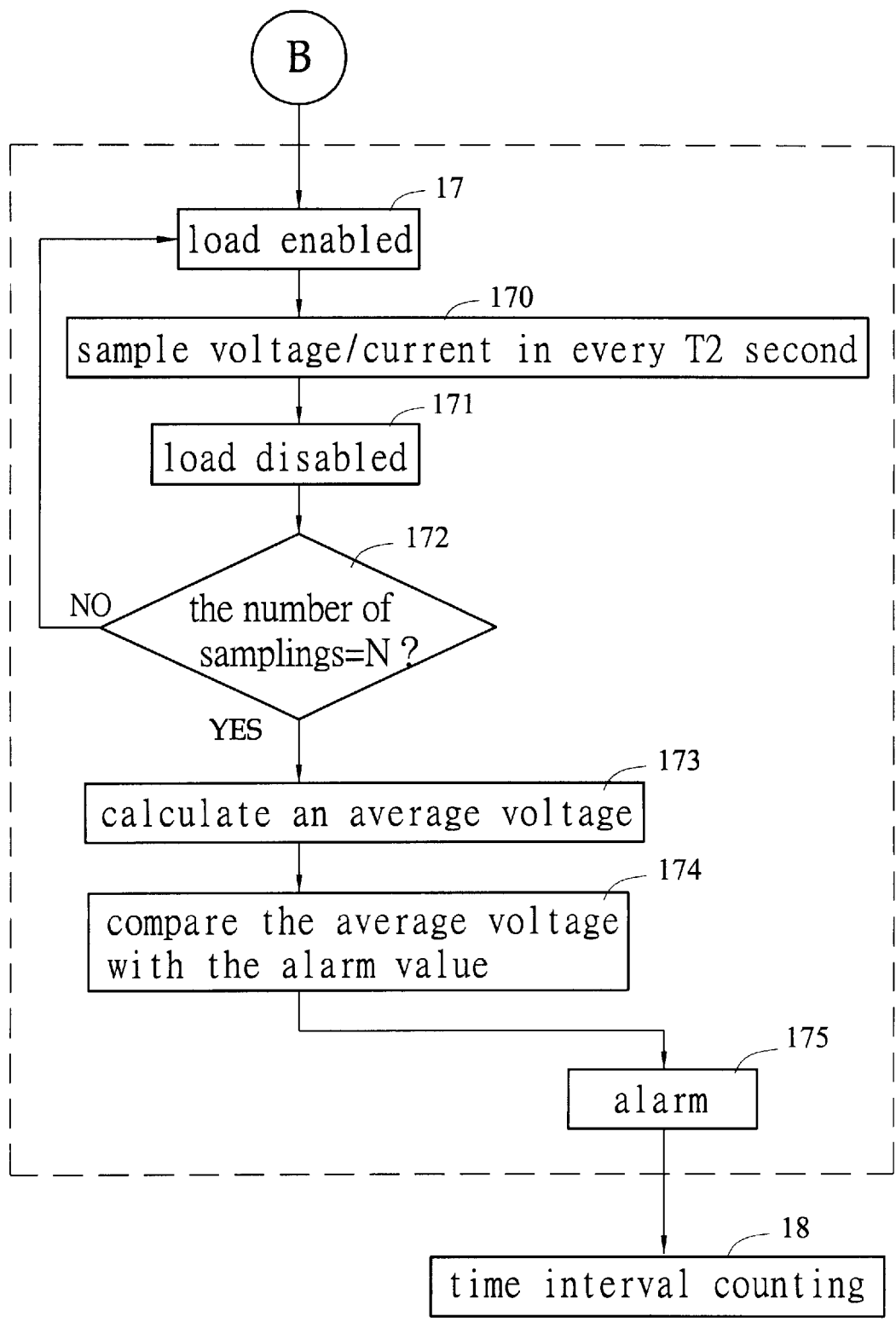

Referring to FIGS. 9, 9A, and 9B, there are shown detailed flow charts illustrating the process in FIG. 8. A process 10' according to the second preferred embodiment of the invention comprises the following steps.

Step 11 is a beginning in which an interrupt vector address is the beginning of the process. Step 12 is an initialization in which registers and I/O pins are initialized and the interrupt vector and a timer are enabled. Next, an initial value of the register is set, the interrupt vector and the timer are enabled, and status and initial value of each pin is defined respectively. In step 13, an outer loop predetermined alarm value $V_{alarm}$, an inner loop predetermined alarm value v, and time parameters t, T2 are set by the invention respectively In step 14, initial value of the ith sampling is set as zero (i.e., count equal to 0) by the invention Further, an open-circuit voltage Vo is measured. In step 18 (i.e., time interval counting), a counter of the invention begins to count the number of time intervals. In step 19 it is determined whether the added time intervals in the inner loop sampling step has reached T2. If not, the process 10' goes to subroutine (A) prior to looping back to step 18. If yes, the process 10' goes to subroutine (B) prior to looping back to step 18. The subroutine (A) is an outer loop sampling program by taking the starting motor S1 as a load. The subroutine (A) comprises the following steps: In step 15, an increment of i is performed. In step 150, the invention samples the battery to be measured B2 every 1/t second for obtaining the ith sampled voltage Vi. In step 151, a voltage curve is obtained by connecting a plurality of continuous sampled voltage values Vi. In step 152, the invention performs a calculating operation to find a function of the minimum voltage $V_{min}$ and then to compare the minimum voltage $V_{min}$ with the current sampled voltage Vi for replacing the current minimum voltage $V_{min}$ with Vi if Vi is less than the current minimum voltage $V_{min}$ In step 153, the invention compares the current minimum voltage $V_{min}$ with the predetermined alarm value $V_{alarm}$. If the minimum voltage $V_{min}$ is equal to or lower than the alarm value $V_{alarm}$ it means that the lowest point of the voltage curve has been reached or passed prior to going to step 16 else it means that the battery to be measured B2 is normal In step 16, an alarm is issued by a display.

The subroutine (B) is an inner loop sampling program by utilizing the internal load of the monitor and alarm device 20 as a load. The subroutine (B) comprises the following steps: In step 17, load is enabled. The power transistor is conducted for increasing the load current. In step 170, sample voltage in every time interval of T2 Also, a current can be derived by dividing the voltage to resistance of the load by the invention. That is, this is also a current sampling step. In step 171, the load is disabled. The power transistor is cut off for cutting off the load current. In step 172, it is determined whether the number of sampling has reached N, where N is an integer set by the invention. If no, the process loops back to step 17. If yes, the process goes to step 173. In step 173, an average of sampled voltage values is obtained by calculation. Also, this is an average current calculation step by referring to the well known current and voltage equation (i.e., V=IR). In step 174, the invention compares the obtained average voltage with the inner loop predetermined alarm value v. In step 175 (i.e., result display), a result of comparison in step 174 is displayed on the display. Further, an alarm is issued if the alarm value is reached in step 174.

Figure 10:
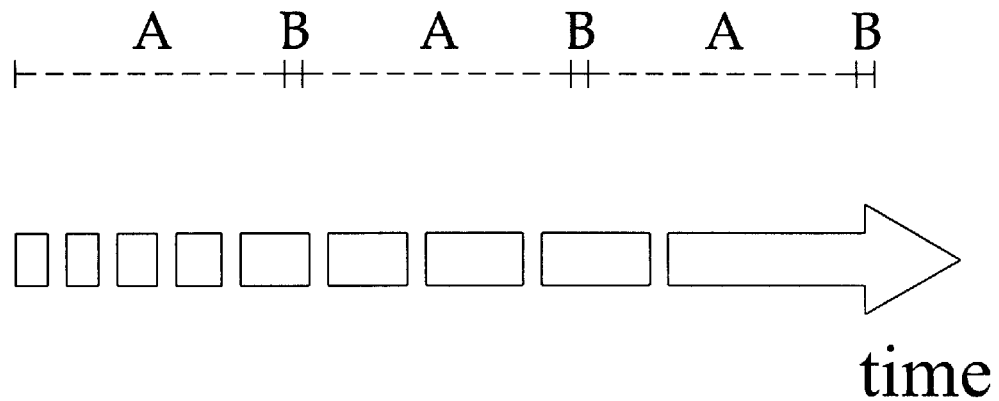
FIG. 10 is a diagram of time interval according to the second preferred embodiment process of the invention.
Figure 11:
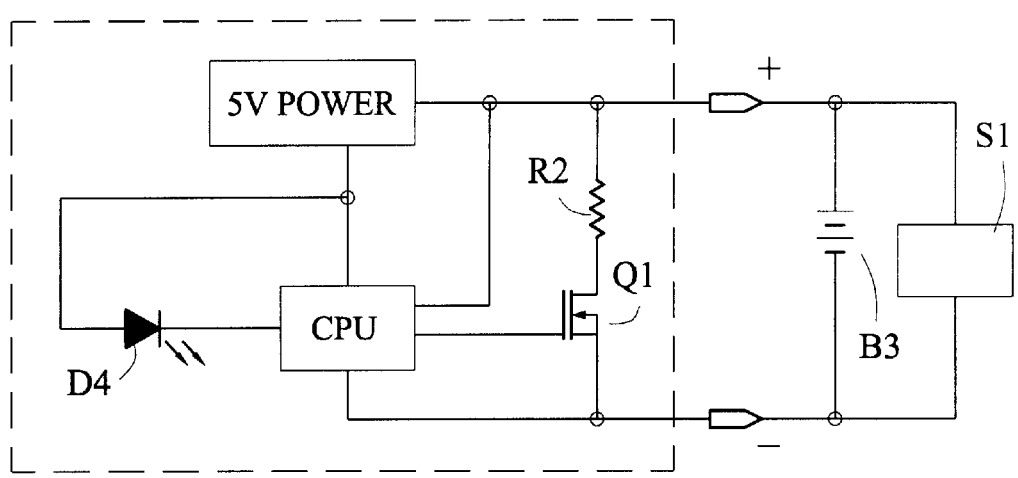
FIG. 11 is a circuit diagram according to a second preferred embodiment of the apparatus of the invention.

Referring to FIG. 10, there is shown a diagram of time interval according to the second preferred embodiment process of the invention Each of the subroutines (A) and (B) alternatively performs different monitoring modes by suitably dividing time into a plurality of time intervals so as to optimize the same Referring to FIG. 11, there is shown a circuit diagram according to the second preferred embodiment of the apparatus of the invention. As shown, a power transistor is labeled as Q1, a resistor as a load is labeled as R2, a battery to be measured is labeled as B3, a starting motor is labeled as S1, and a LED is labeled as D4. The resistor R2 may be eliminated if desired.

Note that t has a value between 1 and 10000. Preferably, t is 1000. T has a value lower than 1000 μsec. Preferably, T has a value of 50 μsec Preferably, N has a value between 2 and 4.

Further note that $V_{min}$ is obtained at the lowest point of the voltage curve during engine starting in the above embodiments. In fact, $V_{min}$ can be obtained at any of other points of the voltage curve during engine starting as shown in FIG. 3A As shown, voltage at any point of a curve section from the point P2 (i.e., the engine is starting) to the point P5 (i.e., charging point of the alternator) can be taken as a battery measurement point without departing from the scope and spirit of the invention.

While the invention herein disclosed has been described by means of specific embodiments, numerous modifications and variations could be made thereto by those skilled in the art without departing from the scope and spirit of the invention set forth in the claims.

What is claimed is:

1. In an apparatus provided in a motor vehicle, the apparatus comprising:

a monitor and alarm device directly parallel connected to both a battery to be measured and a starting motor of the motor vehicle;

wherein the starting motor is taken as a load for forming an outer loop sampling circuit, 1/t second is set as a sampling time interval during discharging, voltage curve is formed by connecting a plurality of continuous sampled voltage values each sampled in 1/t second, wherein the battery to be measured begins from a point P1 to a point P2 where an engine of the motor vehicle is beginning to start, then the voltage measured at battery terminals is significantly and temporarily dropped down and formed a lowest point P3 of the voltage curve during the engine starting at a very beginning period, thus a minimum voltage value is obtained, in a subsequent section, a plurality of points P4 of ripples voltage values are continuously formed to represent that the engine has been started for a very short time period, and a final point P5 represents a charging point of an alternator, and a minimum voltage value from any point of points P2 to P4 of the voltage curve is compared with a predetermined alarm voltage value for determining a status of the battery to be measured, and an alarm is issued in time if the status of the battery to be measured is abnormal.

2. A method of monitoring the motor vehicle's electric power comprising the steps of:

(a) in an outer loop sampling: taking a starting motor as a load, and sampling a battery to be measured every 1/t second for obtaining a sampled voltage;

(b) in a data storage: obtaining a voltage curve by connecting a plurality of continuous voltage values each sampled in every 1/t second;

(c) in a calculation: calculating a minimum voltage and recording the same;

(d) in a comparison: comparing a recorded minimum voltage with a predetermined alarm value so that if the minimum voltage is higher than the predetermined alarm voltage value, it meaning that the battery to be measured is normal else it meaning that a lowest point of the voltage curve has been reached or passed and the battery to be measured is determined to be abnormal;

(e) in a result display: displaying a result of the calculation in the step (c) on a display, and issuing an alarm if the predetermined alarm value is reached in the step (d);

(f) as a beginning: setting an interrupt vector address as a beginning of the process;

(g) as an initialization: initializing registers and input/output (I/O) pins and enabling the interrupt vector and a timer, setting an initial value of a register, enabling the interrupt vector and the timer, and defining a status and an initial value of each pin respectively;

(h) setting a predetermined alarm value Valarm and a time parameter t;

(i) setting an initial value of an ith sampling as zero and measuring an open-circuit voltage Vo;

(j) performing an increment of a number of a samplings i;

(k) sampling the battery to be measured every 1/t second for obtaining the ith sampled voltage;

(l) obtaining a voltage curve by connecting a plurality of continuous sampled voltage values Vi;

(m) performing a calculating operation to find a function of a minimum voltage Vmin and then to compare the minimum voltage Vmin with the current sampled voltage Vi for replacing the current minimum voltage Vmin with Vi if Vi less than the current minimum voltage Vmin;

(n) comparing the current minimum voltage Vmin with a predetermined alarm value Valarm wherein if the minimum voltage Vmin is equal to or lower than the alarm value Valarm it meaning that the lowest point of the voltage curve has been reached or passed and the process goes to step 16 (o) else the process loops back to the step 15 (j) representing the battery to be measured is normal; and (o) issuing an alarm by a display prior to looping back to the step (j);

whereby it is of repeatedly performing the steps (a) to (e) for monitoring the battery to be measured for a long time, thereby informing a driver of a rower level of the battery prior to starting an engine by noticing whether an alarm has been issued.

3. The method of claim 2, wherein t has a value between 1 and 10000 and preferably t is 1000.

4. The method of claim 2, wherein the minimum voltage Vmin is obtained at the lowest point of the voltage curve during an engine starting.

5. The method of claim 2, wherein the minimum voltage Vmin is obtained at any of other points of the voltage curve during an engine starting so that a voltage value at any point of a curve section from a point P2 where the engine is starting to a point P5 where an alternator is charging is taken as a battery measurement point.

6. An apparatus of monitoring a motor vehicle's electric power, the apparatus comprising a monitor and alarm device directly parallel connected to a current source to be measured, the monitor and alarm device comprising:

one of a CPU (central processing unit) and a MCU (microprocessor control unit) being directly parallel connected to the current source to be measured and operative to control sampling of voltage, data storage, calculation, comparison, and result display;

a stabilization circuit being operative to provide a constant current to one of the CPU and the MCU and the device for operation;

a display circuit commanded by one of the CPU and the MCU to show a measurement result on a LCD (liquid crystal display) or any of other displays;

wherein the current source to be measured includes a battery to be measured and a parallel starting motor.

7. The apparatus of claim 6, wherein the monitor and alarm device further comprises a current control circuit commanded by the CPU or the MCU to control and adjust current on a load for measuring an output power of the current source to be measured.

8. The apparatus of claim 6, wherein the monitor and alarm device further comprises:

a voltage sampling circuit commanded by one of the CPU and the MCU to fetch voltage data from the current source to be measured every 1/t second and to send the fetched voltage data to one of the CPU and the MCU for processing; and an audio alarm circuit commanded by one of the CPU and the MCU to issue an audio alarm on a low power of the battery to be measured or an alternator damage;

whereby an audible warning is being issued to any of occurred irregularities including battery aging, battery damage, and other malfunctioned electrical devices.

9. The apparatus of claim 6, wherein the monitor and alarm device further comprises;

a power detection circuit commanded by one of the CPU and the MCU to fetch voltage and current data from the current source to be measured for sending to one of the CPU and the MCU to determine a status of the battery to be measured and subsequently send a status to one of the CPU and the MCU for processing;

a digital display commanded by one of the CPU and the MCU to display a measurement result in a digital form; and a digital signal interface converter commanded by one of the CPU and the MCU to communicate with an external through an interface based on the measurement result;

whereby it is of detecting any of other direct current sources, alternatively performing different monitoring modes, determining whether there is no power or insufficient charging of the current source to be measured by a power detection circuit, and issuing an early warning by light or sound by one of the CPU and the MCU by display by the digital display.

10. The apparatus of claim 6, wherein the monitor and alarm device further comprises:

a battery temperature sensor; and a battery temperature detection circuit for sending temperature data of the battery to be measured sensed by a battery temperature sensor to one of the CPU and the MCU so as to calculate a correct available power of the battery to be measured by referring to a characteristic curve of battery temperature without being adversely affected by environment factors;

wherein a correct available power of the battery to be measured is in turn used for modifying the predetermined alarm value.

11. In an apparatus provided in a motor vehicle, the apparatus including a monitor and alarm device parallel connected to both a battery to be measured and a starting motor of the motor vehicle wherein a double loop technique is employed to monitor an available power of a current source to be measured in a long time basis, the starting motor is taken as a load for forming an outer loop sampling circuit, an inner loop sampling circuit is formed by utilizing an internal load of the monitor and alarm device, and alternatively performs different monitoring modes by suitably dividing time into a plurality of time intervals, a method of monitoring the motor vehicle's electric power in the outer loop sampling circuit comprising the steps of:

(a) in an outer loop sampling: taking the starting motor as the load, and sampling the battery to be measured every 1/t second for obtaining a sampled voltage;

(b) in a data storage: obtaining the voltage curve by connecting a plurality of continuous voltage values;

(c) in a calculation: calculating a minimum voltage and recording the same;

(d) in a comparison: comparing the recorded minimum voltage with the predetermined alarm value so that if the minimum voltage is higher than the predetermined alarm value it meaning that the battery to be measured is normal else it meaning that a lowest point of the voltage curve has been reached or passed and the battery to be measured is determined to be abnormal; and (e) in a result display: displaying a result of the calculation in the step (c) on a display, and issuing an alarm if the predetermined alarm value is reached in the step (d);

whereby it is of repeatedly performing the steps (a) to (e) for monitoring the battery to be measured for a long time, thereby informing a driver of a power level of the battery prior to starting an engine by noticing whether an alarm has been issued;

a method of monitoring the motor vehicle's electric power in the inner loop sampling circuit comprising the steps of:

(f) in an inner loop sampling: setting an internal load of the monitor and alarm device as a load, discharging the battery to be measured every T2 second by quickly switching a power transistor for obtaining a sampled voltage, and repeating the discharging N times so as to obtain N sampled voltage values;

(g) in a calculation: calculating an average voltage and recording the same;

(h) in a comparison: comparing the average voltage obtained in the step (g) with a predetermined alarm value, displaying a result of the comparison in the step (e) on the display, and issuing an alarm if the predetermined alarm value is reached; and (i) in a time interval of measurement: measuring an available power of the battery to be measured every T2 second and waiting a predetermined period of time for a next measurement;

whereby it is of monitoring the battery to be measured for a long time by repeating the steps (f) to (i).

12. The method of claim 11, further comprising a process comprising:

step 11 as a beginning setting an interrupt vector address as an beginning of the process;

step 12 as an initialization initializing registers and input/output (I/O) pins and enabling the interrupt vector and a timer, setting an initial value of a register, enabling the interrupt vector and the timer, and defining a status and an initial value of each pin respectively;

step 13 setting an outer loop predetermined alarm value Valarm, an inner loop predetermined alarm value v, and a time parameters t, T2;

step 14 setting an initial value of an ith sampling as zero and measuring an open-circuit voltage Vo;

step 18 as a counting of time interval counting a number of time intervals by a counter; and step 19 determining whether an added time intervals in the inner loop sampling step has reached T2 wherein if not, the process goes to a subroutine (A) prior to looping back to the step 18 else goes to a subroutine (B) prior to looping back to the step 18.

13. The method of claim 12, wherein the subroutine (A) is an outer loop sampling program by taking the starting motor S1 as a load, the subroutine (A) comprises:

step 15 performing an increment of a number of samplings i;

step 150 sampling the battery to be measured every 1/t second for obtaining the ith sampled voltage;

step 151 obtaining a voltage curve by connecting a plurality of continuous sampled voltage values Vi;

step 152 performing a calculating operation to find a function of a minimum voltage Vmin and then to compare the minimum voltage Vmin with the current sampled voltage Vi for replacing the current minimum voltage Vmin with Vi if Vi less than the current minimum voltage Vmin;

step 153 comparing the current minimum voltage Vmin with the predetermined alarm value Valarm wherein if the minimum voltage Vmin is equal to or lower than the alarm value Valarm it meaning that the lowest point of the voltage curve has been reached or passed and the subroutine (A) goes to step 16 else the subroutine (A) loops back to the step 15 representing the battery to be measured is normal; and step 16 issuing an alarm by a display.

14. The method of claim 13, wherein the minimum voltage Vmin is obtained at the lowest point of the voltage curve during the engine starting.

15. The method of claim 13, wherein the minimum voltage Vmin is obtained at any of other points of the voltage curve during the engine starting so that a voltage value at any point of a curve section from a point P2 where the engine is starting to a point P5 where an alternator is charging is taken as a battery measurement point.

16. The method of claim 12, wherein the subroutine (B) is an inner loop sampling program by utilizing an internal load of the monitor and alarm device, the subroutine (B) comprises:

step 17 enabling a load, conducting a power transistor for increasing a load current;

step 170 sampling voltage in every time interval of T2 and deriving a current by dividing a voltage to a resistance of the load so that this is also a current sampling step;

step 171 disabling the load and cutting off the power transistor for cutting off the load current;

step 172 determining whether a number of sampling has reached an integer N wherein if not, the subroutine (B) loops back to the step 17;

step 173 obtaining an average of the sampled voltage values by calculation so that this is an average current calculation step;

step 174 comparing an average voltage with the inner loop predetermined alarm value v; and step 175 displaying a result of a comparison in the step 174 on a display and issuing an alarm if the alarm value is reached in the step 174.

17. The method of claim 12, wherein t has a value between 1 and 10000 and preferably t is 1000.

18. The method of claim 12, wherein T2 has a value lower than 1000 μsec and preferably T2 has a value of 50 μsec, and preferably N has a value between 2 and 4.

* * * * *

UNITED STATES PATENT AND TRADEMARK OFFICE
CERTIFICATE OF CORRECTION

PATENT NO.    : 6,791,464 B2
DATED         : September 14, 2004
INVENTOR(S)   : Yung-Sheng Huang It is certified that error appears in the above-identified patent and that said Letters Patent is hereby corrected as shown below:

<u>Title page,</u>
Item [75], Inventor, should read as follows:
-- [75] Inventor: Yung-Sheng Huang, Taipei (TW) --

Signed and Sealed this

Sixteenth Day of November, 2004

JON W. DUDAS
*Director of the United States Patent and Trademark Office*